(12) United States Patent
Nakagawa et al.

(10) Patent No.: US 9,735,110 B2
(45) Date of Patent: Aug. 15, 2017

(54) SEMICONDUCTOR DEVICE AND SEMICONDUCTOR DEVICE MANUFACTURING METHOD

(75) Inventors: Ryosuke Nakagawa, Kyoto (JP); Yuichi Nakao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 899 days.

(21) Appl. No.: 12/998,202

(22) PCT Filed: Sep. 25, 2009

(86) PCT No.: PCT/JP2009/004884
§ 371 (c)(1),
(2), (4) Date: Mar. 25, 2011

(87) PCT Pub. No.: WO2010/035481
PCT Pub. Date: Apr. 1, 2010

(65) Prior Publication Data
US 2011/0175193 A1 Jul. 21, 2011

(30) Foreign Application Priority Data

Sep. 26, 2008 (JP) ................................. 2008-248903
Sep. 26, 2008 (JP) ................................. 2008-248904

(51) Int. Cl.
*H01L 23/532* (2006.01)
*H01L 21/768* (2006.01)
*H01L 23/522* (2006.01)

(52) U.S. Cl.
CPC .. *H01L 23/53295* (2013.01); *H01L 21/76801* (2013.01); *H01L 21/76829* (2013.01); *H01L 23/5227* (2013.01); *H01L 23/53238* (2013.01); *H01L 2924/0002* (2013.01)

(58) Field of Classification Search
CPC ......... H01L 21/76801; H01L 21/76829; H01L 23/5227; H01L 23/53295; H01L 23/53238; H01L 2924/0002; H01L 2924/00
USPC ................. 257/751, E21.545, E23.161, 531; 438/666
See application file for complete search history.

(56) References Cited

U.S. PATENT DOCUMENTS

| | | |
|---|---|---|
| 5,986,299 A | 11/1999 | Nakamura et al. |
| 6,303,478 B1 | 10/2001 | Nakamura et al. |
| 6,362,091 B1 | 3/2002 | Andideh et al. |
| 6,432,845 B1 | 8/2002 | Morozumi |
| 6,639,298 B2 | 10/2003 | Chaudhry et al. |
| 2004/0084777 A1 | 5/2004 | Yamanoue et al. |
| 2005/0191828 A1* | 9/2005 | Al-Bayati ......... H01J 37/32082 438/514 |
| 2005/0230837 A1 | 10/2005 | Taghizadeh-Kaschani |

(Continued)

FOREIGN PATENT DOCUMENTS

| | | |
|---|---|---|
| EP | 0 851 480 A2 | 7/1998 |
| EP | 0851480 A2 * | 7/1998 |

(Continued)

OTHER PUBLICATIONS

English Abstracts of JP 60233829 A.*

*Primary Examiner* — Hrayr A Sayadian
(74) *Attorney, Agent, or Firm* — Rabin & Berdo, P.C.

(57) ABSTRACT

A semiconductor device according to the present invention includes a semiconductor substrate, and an interlayer dielectric film, formed on the semiconductor substrate, having a multilayer structure of a compressive stress film and a tensile stress film.

13 Claims, 9 Drawing Sheets

(56) References Cited

U.S. PATENT DOCUMENTS

| | | |
|---|---|---|
| 2006/0003572 A1 | 1/2006 | Chen et al. |
| 2006/0276027 A1* | 12/2006 | Lu et al. ............... 438/622 |
| 2007/0037384 A1 | 2/2007 | Su et al. |
| 2007/0082507 A1* | 4/2007 | Iyer ............... C23C 16/345 |
| | | 438/795 |
| 2011/0175193 A1* | 7/2011 | Nakagawa ............... 257/531 |

FOREIGN PATENT DOCUMENTS

| | | | |
|---|---|---|---|
| JP | 60-233829 A | | 11/1985 |
| JP | 60233829 A | * | 11/1985 |
| JP | 01-241134 A | | 9/1989 |
| JP | 09-213800 A | | 8/1997 |
| JP | 10-135425 | | 5/1998 |
| JP | 2000-306995 A | | 11/2000 |
| WO | WO2010/035481 | * | 4/2010 |

\* cited by examiner

PRIOR ART

FIG. 5

SEMICONDUCTOR DEVICE AND SEMICONDUCTOR DEVICE MANUFACTURING METHOD

TECHNICAL FIELD

The present invention relates to a semiconductor device, particularly a power semiconductor device and a method of manufacturing the same.

BACKGROUND ART

In recent years, a power semiconductor device (hereinafter referred to as a "transformer device") including a transformer has been developed in the field of power electronics.

Figure 5:
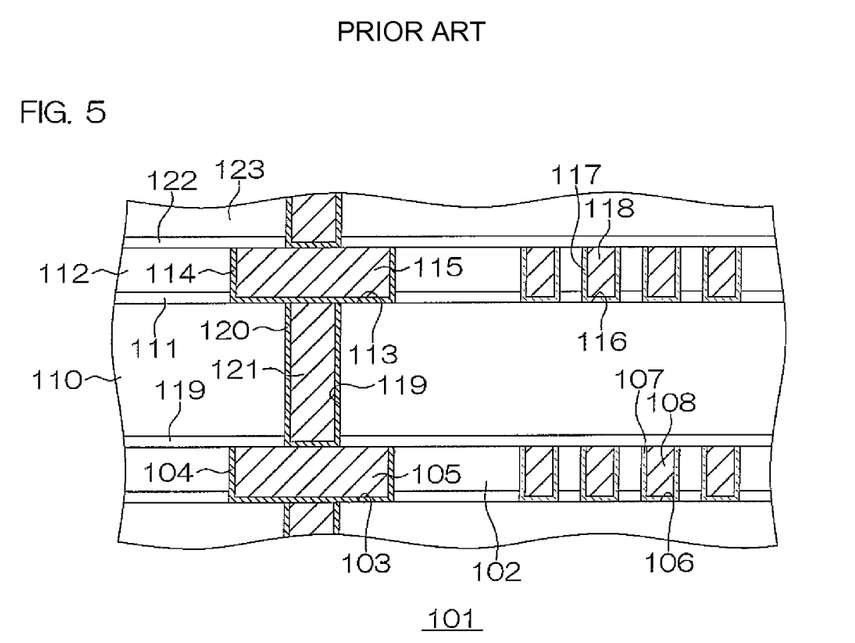
FIG. 5 is a schematic sectional view of a conventional transformer device.

FIG. 5 is a schematic sectional view of a transformer device.

A transformer device 101 includes a first wiring layer 102 made of $SiO_2$ (silicon oxide) on an unshown semiconductor substrate.

A first wiring trench 103 is formed in the first wiring layer 102. A first wire 105 made of a metallic material (hereinafter referred to as a "Cu wire material") mainly composed of Cu (copper) is embedded in the first wiring trench 103 through a barrier metal 104. A coil groove 106, spiral in plan view, having the same depth as the first wiring trench 103 is formed in the first wiring layer 102 at an interval from the first wiring trench 103. A first coil 108 is embedded in the coil grove 106 through a barrier metal 107.

A diffusion preventing/etching stopper film 109 made of SiN and an interlayer dielectric film 110 made of $SiO_2$ are stacked on the first wiring layer 102. Further, an etching stopper film 111 made of SiN and a second wiring layer 112 made of $SiO_2$ are stacked on the interlayer dielectric film 110.

A second wiring trench 113 is formed in the second wiring layer 112. The second wiring trench 113 is dug down from the upper surface of the second wiring layer 112 to the upper surface of the interlayer dielectric film 110. A second wire 115 made of a Cu wire material is embedded in the second wiring trench 113 through a barrier metal 114. A coil groove 116, spiral in plan view, having the same depth as the second wiring trench. 113 is formed in the second wiring layer 112 at an interval from the second wiring trench 113. A second coil 118 constituting a transformer along with the first coil 108 is embedded in the coil groove 116 through a barrier metal 117.

The second wiring trench 113 is formed in a pattern having a portion intersecting with the first wire 105 in plan view. In the portion where the first wire 105 and the second wiring trench 113 (the second wire 115) intersect with each other in plan view, a via hole 119 passing through the diffusion preventing/etching stopper film 109 and the interlayer dielectric film 110 is formed between the first wire 105 and the second wiring trench 113. A via 121 is embedded in the via hole 119 through a barrier metal 120. Thus, the first wire 105 and the second wire 115 are electrically connected with each other through the via 121.

A diffusion preventing/etching stopper film 122 and an interlayer dielectric film 123 are stacked on the second wiring layer 112.

PRIOR ART DOCUMENT

Patent Document

Patent Document 1: US2005/0230837A1

SUMMARY OF THE INVENTION

Problems to be Solved by the Invention

An extremely large potential difference is caused between the first coil 108 and the second coil 118 constituting the transformer. Therefore, the interlayer dielectric film 110 interposed between the first coil 108 and the second coil 118 must have a large thickness capable of exhibiting a withstand voltage (3500 V, for example) not causing dielectric breakdown resulting from the potential difference. In order to ensure dielectric strength of 3500 V for the interlayer dielectric film 110, for example, the thickness of the interlayer dielectric film 110 must be about 5 µm, since the dielectric strength of $SiO_2$ is about 6 to 7 MV/cm.

However, the interlayer dielectric film 110 made of $SiO_2$ has compressive stress. If the interlayer dielectric film 110 has a large thickness, therefore, the semiconductor substrate causes remarkable warping deformation convexed on the side of the interlayer dielectric film 110. If a matrix for the semiconductor substrate is a semiconductor wafer having a diameter of 300 mm, particularly remarkable warping deformation may be caused, and the semiconductor wafer may be impossible to handle.

An object of the present invention is to provide a semiconductor device and a method of manufacturing the same, each capable of inhibiting a semiconductor substrate from causing warping deformation in such a structure that an interlayer dielectric film having a relatively large thickness is formed on the semiconductor substrate (a semiconductor wafer).

Means for Solving the Problems

A semiconductor device according to an aspect of the present invention includes a semiconductor substrate, and an interlayer dielectric film, formed on the semiconductor substrate, having a multilayer structure of a compressive stress film and a tensile stress film.

According to the structure, the interlayer dielectric film formed on the semiconductor substrate has the multilayer structure of the compressive stress film and the tensile stress film. Therefore, compressive stress of the compressive stress film and tensile stress of the tensile stress film cancel each other on the semiconductor substrate. Even if the interlayer dielectric film is formed in a relatively large thickness, therefore, the semiconductor substrate can be inhibited from causing warping deformation.

The interlayer dielectric film may have a multilayer structure of not less than three layers alternately repetitively formed by the compressive stress film and the tensile stress film. The compressive stress film and the tensile stress film are alternately stacked, so that the thickness of the interlayer dielectric film can be increased while inhibiting the semiconductor substrate from causing warping deformation.

The interlayer dielectric film may include a plurality of the compressive stress films. The semiconductor device may further include a first wire provided on a side of the interlayer dielectric film closer to the semiconductor substrate, a second wire opposed to the first wire through the interlayer dielectric film, and a plurality of vias, provided in via holes passing through the respective compressive stress films respectively, for electrically connecting the first wire and the second wire with each other.

In order to form the via holes in the compressive stress films, selective etching of the compressive stress films is performed. In order to embed the vias in the via holes, further, planarization (planarization by CMP (Chemical Mechanical Polishing), for example) of a material for the vias formed on the compressive stress films and the surfaces of the compressive stress films is performed. These treatments (steps) reduce the compressive stress of the compressive stress films. Therefore, the semiconductor substrate can be inhibited from causing warping deformation also by providing the vias on the compressive stress films.

In the case where the via holes are formed in the respective compressive stress films, the tensile stress film is preferably made of a material having etching selectivity with respect to the material for the compressive stress films. Thus, the tensile stress film can be utilized as an etching stopper in the etching for forming the via holes in the compressive stress films.

The vias may be made of a metallic material containing Cu, and in this case, the tensile stress film is preferably made of a material having a barrier property against Cu. Cu contained in the vias can be prevented from diffusing into the compressive stress films formed on the vias, due to the tensile stress film.

Further, the first wire may be made of a metallic material containing Cu, and in this case, the semiconductor device preferably further includes a barrier film, interposed between the interlayer dielectric film and the first wire, made of a material having a barrier property against Cu. Cu contained in the first wire can be prevented from diffusing into the interlayer dielectric film, due to the barrier film.

The barrier film preferably has tensile stress. The compressive stress of the compressive stress films of the interlayer dielectric film can be canceled, due to the tensile stress of the barrier film. Consequently, the semiconductor substrate can be more effectively inhibited from causing warping deformation.

A semiconductor device according to another aspect of the present invention includes a semiconductor substrate, an interlayer dielectric film, formed on the semiconductor substrate, having a multilayer structure of a plurality of first dielectric films, a first coil provided on a side of the interlayer dielectric film closer to the semiconductor substrate, a second coil, opposed to the first coil through the interlayer dielectric film, for constituting a transformer along with the first coil, and a plurality of vias provided in via holes passing through the respective first dielectric films respectively.

According to the structure, the interlayer dielectric film formed on the semiconductor substrate has the multilayer structure of the plurality of first dielectric films. The first coil and the second coil constituting the transformer are provided on the semiconductor substrate, and oppose to each other through the interlayer dielectric film. The via holes passing through the first dielectric films are formed in the respective first dielectric films, and the vias are embedded in the respective via holes.

In order to form the via holes in the first dielectric films, selective etching of the first dielectric films is performed. In order to embed the vias in the via holes, further, planarization (planarization by CMP, for example) of a material for the vias formed on the first dielectric films and the surfaces of the first dielectric films is performed. Even if the first dielectric films are compressive stress films having compressive stress, these treatments (steps) reduce the compressive stress of the first dielectric films. Even if the interlayer dielectric film is formed in a relatively large thickness, therefore, the semiconductor substrate can be inhibited from causing warping deformation.

The semiconductor device according to the other aspect can be manufactured by a manufacturing method including the following steps I to III:

I. a step of forming a first coil on a semiconductor substrate,

II. a step of forming an interlayer dielectric film having a multilayer structure of a plurality of first dielectric films on the first coil by repeating the steps of forming a first dielectric film, forming a via hole in the first dielectric film by etching, and embedding a via in the via hole in this order, and III. a step of forming a second coil for constituting a transformer along with the first coil on a position opposed to the first coil through the interlayer dielectric film.

The interlayer dielectric film may include a second dielectric film, made of a material different from the material for the first dielectric films, between the first dielectric films. Preferably in this case, the first dielectric films are compressive stress films, and the second dielectric film is a tensile stress film. In other words, the interlayer dielectric film preferably has a multilayer structure of a plurality of compressive stress films and a tensile stress film. According to the structure, compressive stress of the compressive stress films and tensile stress of the tensile stress film cancel each other on the semiconductor substrate. Even if the interlayer dielectric film is formed in a relatively large thickness, therefore, the semiconductor substrate can be more inhibited from causing warping deformation.

The semiconductor device according to the other aspect may further include a first wire provided on the side of the interlayer dielectric film closer to the semiconductor substrate and a second wire opposed to the first wire through the interlayer dielectric film. In this case, the vias may electrically connect the first wire and the second wire with each other.

Alternatively, the vias may be dummy vias not contributing to the electrical connection between the first wire and the second wire.

The second dielectric film is preferably made of a material having etching selectivity with respect to the material for the first dielectric films. Thus, the tensile stress film can be utilized as an etching stopper in the etching for forming the via holes in the compressive stress films.

The vias may be made of a metallic material containing Cu, and in this case, the second dielectric film is preferably made of a material having a barrier property against Cu. Cu contained in the vias can be prevented from diffusing into the first dielectric films formed on the vias, due to the second dielectric film.

The first wire may be made of a metallic material containing Cu, and in this case, the semiconductor device preferably further includes a barrier film, interposed between the interlayer dielectric film and the first wire, made of a material having a barrier property against Cu. Cu contained in the first wire can be prevented from diffusing into the interlayer dielectric film, due to the barrier film.

The barrier film preferably has tensile stress. Compressive stress of the compressive stress films of the interlayer dielectric film can be canceled, due to the tensile stress of the barrier film. Consequently, the semiconductor substrate can be more effectively inhibited from causing warping deformation.

The vias are preferably formed by a single damascene process. In the single damascene process, a step of forming a via in a first dielectric film is separately carried out every first dielectric film, and selective etching and planarization of the first dielectric film are performed in each step.

Therefore, the compressive stress of each first dielectric film can be reduced. Consequently, the semiconductor substrate can be effectively inhibited from causing warping deformation.

The foregoing and, other objects, features and effects of the present invention will become more apparent from the following detailed description of the embodiments with reference to the attached drawings.

MODE FOR CARRYING OUT THE INVENTION

Embodiments of the present invention are now described in detail with reference to the attached drawings.

Figure 1:
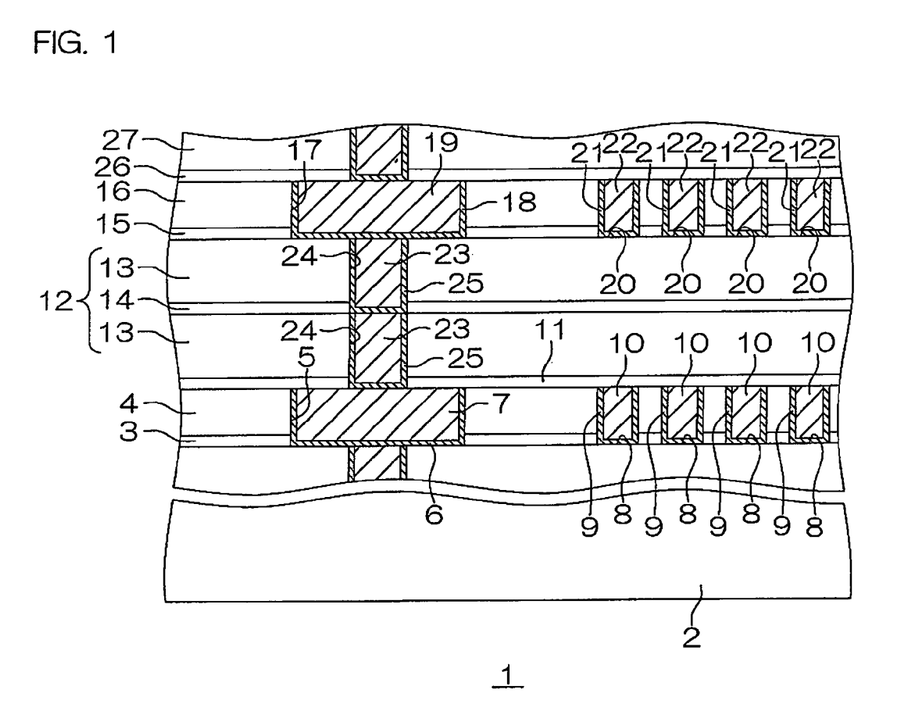
FIG. 1 is a schematic sectional view of a semiconductor device according to an embodiment of the present invention.

FIG. 1 is a schematic sectional view of a semiconductor device according to an embodiment of the present invention.

A semiconductor device 1 is a transformer device, and includes a semiconductor substrate 2. As the semiconductor substrate 2, an Si (silicon) substrate, an SiC (silicon carbide) substrate or the like can be illustrated.

An etching stopper film 3 is stacked on the semiconductor substrate 2. The etching stopper film 3 is made of SiN, and has tensile stress. The thickness of the etching stopper film 3 is 0.3 µm (=300 nm), for example.

A first wiring layer 4 is stacked on the etching stopper film 3. The first wiring layer 4 is made of $SiO_2$, and has compressive stress. The thickness of the first wiring layer 4 is 2.1 µm, for example.

A first wiring trench 5 is formed in the first wiring layer 4. The first wiring trench 5 is in the form of a recess dug down from the upper surface of the first wiring layer 4, and passes through the first wiring layer 4 and the etching stopper film 3 under the first wiring layer 4.

A barrier metal 6 is formed on the inner surfaces (the side surfaces and the bottom surface) of the first wiring trench 5. The barrier metal 6 has a structure obtained by stacking a Ta (tantalum) film, a TaN (tantalum nitride) film and a Ta film in this order from the side of the semiconductor substrate 2. A first wire 7 made of a Cu wire material (a metallic material mainly composed of Cu) is embedded in the first wiring trench 5 through the barrier metal 6. The surface of the first wire 7 is flush with the surface of the first wiring layer 4. Cu contained in the first wire 7 is prevented from diffusing into the first wiring layer 4, due to the barrier metal 6.

In the first wiring layer 4, a first coil groove 8 spiral in plan view is formed at an interval from the first wiring trench 5. The first coil groove 8 has the same depth as the first wiring trench 5, and passes through the first wiring layer 4 and the etching stopper film 3 under the first wiring film 4.

A barrier metal 9 is formed on the inner surfaces (the side surfaces and the bottom surface) of the first coil groove 8. The barrier metal 9 has the same multilayer structure as the barrier metal 6 formed on the inner side surfaces of the first wiring trench 5. In other words, the barrier metal 9 has a structure obtained by stacking a Ta film, a TaN film and a Ta film in this order from the side of the semiconductor substrate. A first coil 10 made of a Cu wire material identical to the material for the first wire 7 is embedded in the first coil groove 8 through the barrier metal 9. The surface of the first coil 10 is flush with the surface of the first wiring layer 4. Cu contained in the first coil 10 is prevented from diffusing into the first wiring layer 4, due to the barrier metal 6.

A diffusion preventing/etching stopper film 11 is stacked on the first wiring layer 4. The diffusion preventing/etching stopper film 11 is made of SiN, and has tensile stress. The thickness of the diffusion preventing/etching stopper film 11 is 0.3 µm, for example. Cu contained in the first wire 7 and the first coil 10 is prevented from diffusing into first dielectric films 13 described below, due to the diffusion preventing/etching stopper film 11.

An interlayer dielectric film 12 is stacked on the diffusion preventing/etching stopper film 11. The interlayer dielectric film 12 has such a multilayer structure that the first dielectric films 13 and a second dielectric film 14 are alternately stacked from the side of the semiconductor substrate 2. More specifically, the interlayer dielectric film 12 has such a three-layer structure that the second dielectric film 14 is interposed between two first dielectric films 13. That is, the interlayer dielectric film 12 does not include the etching stopper film 3, an etching stopper film 15 (described later), a second wiring layer 16 (described later) and the first wiring layer 4. The interlayer dielectric film 12 has a relatively large thickness, e.g., a thickness of 4.5 µm.

The first dielectric films 13 are made of $SiO_2$, and have compressive stress. The thickness of each first dielectric film 13 is 2.1 µm, for example.

The second dielectric film 14 is made of SiN, and has tensile stress. The thickness of the second dielectric film 14 is 0.3 µm, for example.

An etching stopper film 15 is stacked on the interlayer dielectric film 12. The etching stopper film 15 is made of SiN, and has tensile stress. The thickness of the etching stopper film 15 is 0.3 μm (=300 nm), for example.

A second wiring layer 16 is stacked on the etching stopper film 15. The second wiring layer 16 is made of $SiO_2$, and has compressive stress. The thickness of the second wiring layer 16 is 2.1 μm, for example.

A second wiring trench 17 is formed in the second wiring layer 16. The second wiring trench 17 is in the form of a recess dug down from the upper surface of the second wiring layer 16, and passes through the second wiring layer 16 and the etching stopper film 15 under the second wiring layer 16.

A barrier metal 18 is formed on the inner surfaces (the side surfaces and the bottom surface) of the second wiring trench 17. The barrier metal 18 has a structure obtained by stacking a Ta film, a TaN film and a Ta film in this order from the side of the semiconductor substrate 2. A second wire 19 made of a Cu wire material (a metallic material mainly composed of Cu) is embedded in the second wiring trench 17 through the barrier metal 18. The surface of the second wire 19 is flush with the surface of the second wiring layer 17. Cu contained in the second wire 19 is prevented from diffusing into the first dielectric films 13 (the interlayer dielectric film 12) and the second wiring layer 16, due to the barrier metal 18.

In the second wiring layer 16, a second coil groove 20 spiral in plan view is formed at an interval from the second wiring trench 17. The second coil groove 20 has the same depth as the second wiring trench 17, and passes through the second wiring layer 16 and the etching stopper film 15 under the second wiring layer 16.

A barrier metal 21 is formed on the inner surfaces (the side surfaces and the bottom surface) of the second coil groove 20. The barrier metal 21 has the same multilayer structure as the barrier metal 18 formed on the inner surfaces of the second wiring trench 17. In other words, the barrier metal 21 has a structure obtained by stacking a Ta film, a TaN film and a Ta film in this order from the side of the semiconductor substrate 2. A second coil 22 made of a Cu wire material identical to the material for the second wire 19 is embedded in the second coil groove 20 through the barrier metal 21. The surface of the second coil 22 is flush with the surface of the second wiring layer 16. Cu contained in the second coil 22 is prevented from diffusing into the second wiring layer 16, due to the barrier metal 21.

The second wiring trench 17 is formed in a pattern having a portion intersecting with the first wire 7 in plan view. In the portion where the first wire 7 and the second wiring trench 17 intersect with each other in plan view, a plurality of vias 23 are provided in series therebetween.

More specifically, a via hole 24 is formed in each first dielectric film 13 of the interlayer dielectric film 12. The via hole 24 formed in the first dielectric film 13 on the upper-layer side passes through the first dielectric film 13, and further passes through the second dielectric film 14 under the first dielectric film 13. The via hole 24 formed in the first dielectric film 13 on the lower-layer side passes through the first dielectric film 13, and further passes through the diffusion preventing/etching stopper film 11 under the first dielectric film 13. A barrier metal 25 is formed on the inner surface of each via hole 24. The barrier metal 25 has a structure obtained by stacking a Ta film, a TaN film and a Ta film in this order from the side of the semiconductor substrate 2. The via 23 made of a Cu wire material is embedded in each via hole 24 through the barrier metal 25. Cu contained in the via 23 is prevented from diffusing into the first dielectric film 13, due to the barrier metal 25. The first wire 7 and the second wire 19 are electrically connected with each other through the vias 23 and the barrier metals 25.

A diffusion preventing/etching stopper film 26 and an interlayer dielectric film 27 etc. are stacked on the second wiring layer 16. The diffusion preventing/etching stopper film 26 is made of SiN, and has tensile stress. The thickness of the diffusion preventing/etching stopper film 26 is 0.3 μm, for example. Cu contained in the second wire 19 and the second coil 22 is prevented from diffusing into the interlayer dielectric film 27, due to the diffusion preventing/etching stopper film metal 26. The interlayer dielectric film 27 may have a multilayer structure similar to that of the interlayer dielectric film 12, or may have a single-layer structure of $SiO_2$.

One or a plurality of interlayer dielectric films may be interposed between the semiconductor substrate 2 and the etching stopper film 3. In this case, each interlayer dielectric film may have a multilayer structure similar to that of the interlayer dielectric film 12, or may have a single-layer structure of $SiO_2$. Further, another wire may be formed under the first wire 7. In this case, the first wire 7 is electrically connected with the wire under the first wire 7 through a via 28, as shown in FIG. 1. Needless to say, the first wiring layer 4 may be formed in contact with the semiconductor substrate 2, and the first wire 7 may be the lowermost wire.

Figure 2:
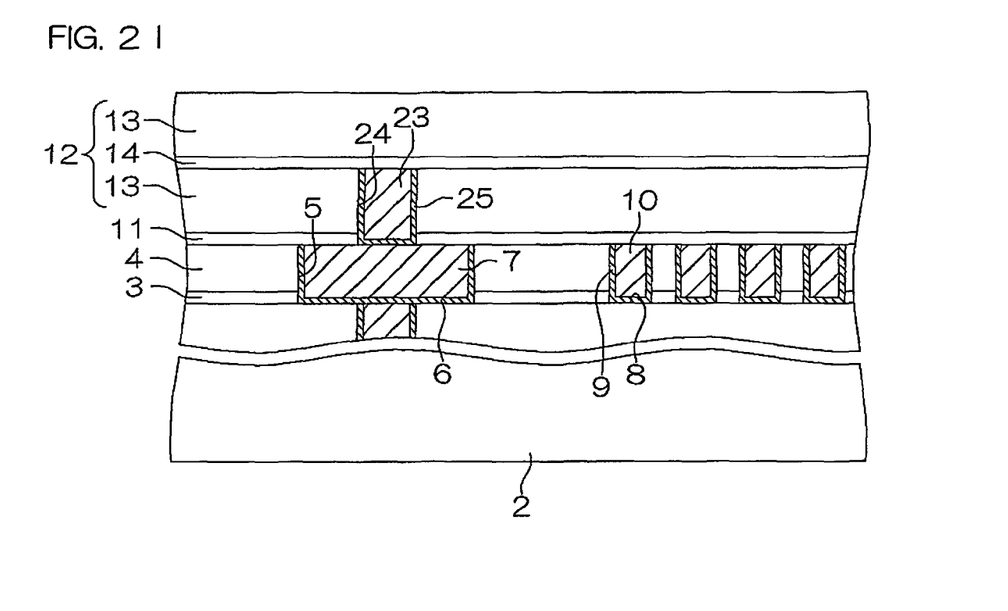
FIG. 2A is a schematic sectional view for illustrating a method of manufacturing the semiconductor device shown in FIG. 1.
FIG. 2B is a schematic sectional view showing a step subsequent to FIG. 2A.
FIG. 2C is a schematic sectional view showing a step subsequent to FIG. 2B.
FIG. 2D is a schematic sectional view showing a step subsequent to FIG. 2C.
FIG. 2E is a schematic sectional view showing a step subsequent to FIG. 2D.
FIG. 2F is a schematic sectional view showing a step subsequent to FIG. 2E.
FIG. 2G is a schematic sectional view showing a step subsequent to FIG. 2F.
FIG. 2H is a schematic sectional view showing a step subsequent to FIG. 2G.
FIG. 2I is a schematic sectional view showing a step subsequent to FIG. 2H.
FIG. 2J is a schematic sectional view showing a step subsequent to FIG. 2I.
FIG. 2K is a schematic sectional view showing a step subsequent to FIG. 2J.
FIG. 2L is a schematic sectional view showing a step subsequent to FIG. 2K.
FIG. 2M is a schematic sectional view showing a step subsequent to FIG. 2L.
FIG. 2N is a schematic sectional view showing a step subsequent to FIG. 2M.
Figure 2A:
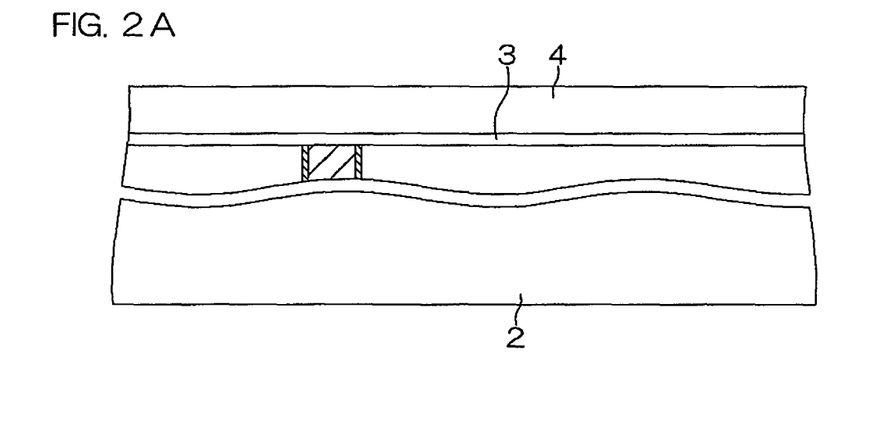
Figure 2B:
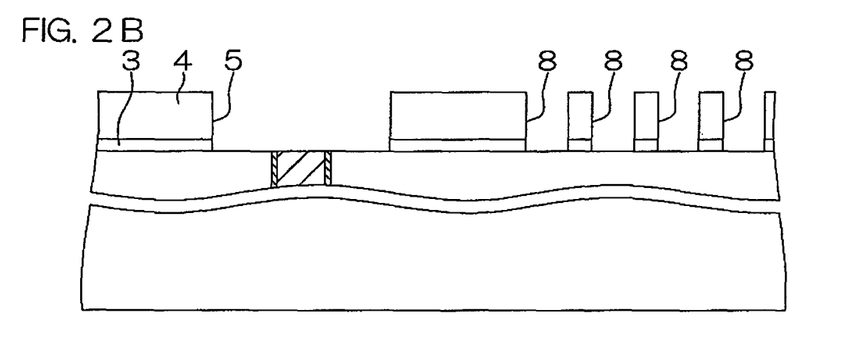
Figure 2C:
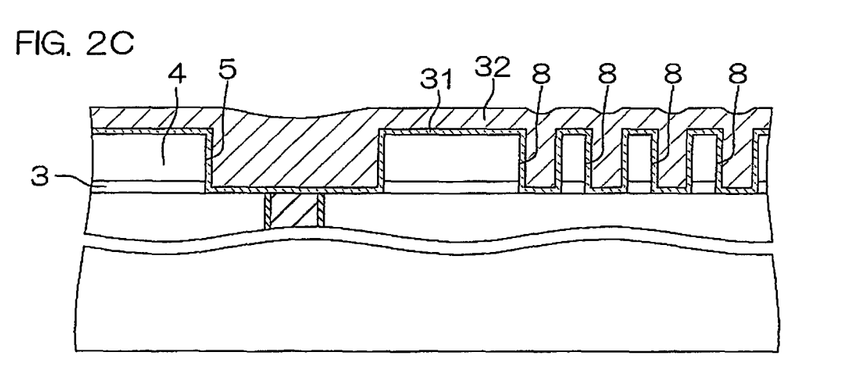
Figure 2D:
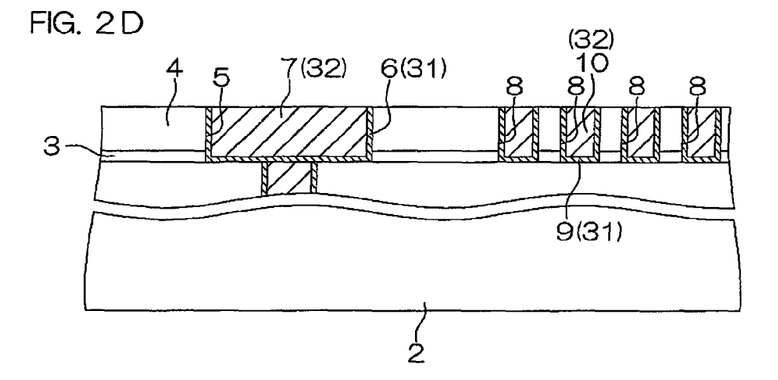
Figure 2E:
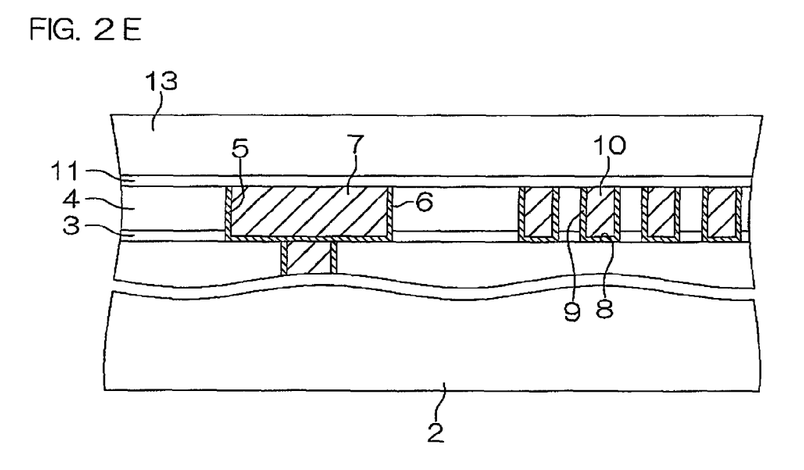
Figure 2F:
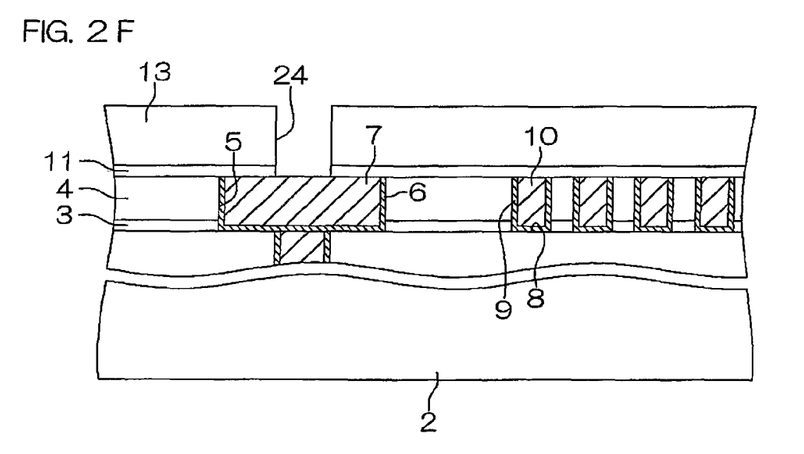
Figure 2G:
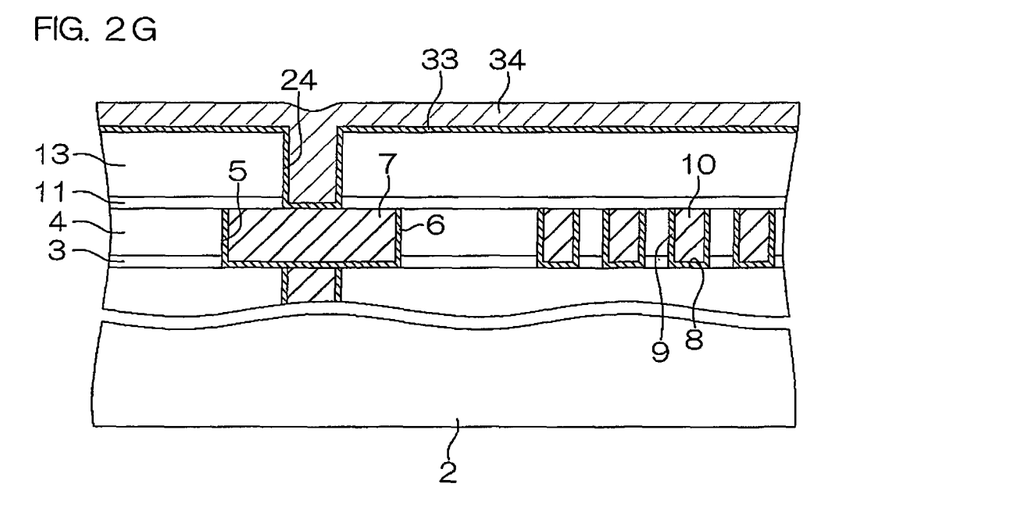
Figure 2H:
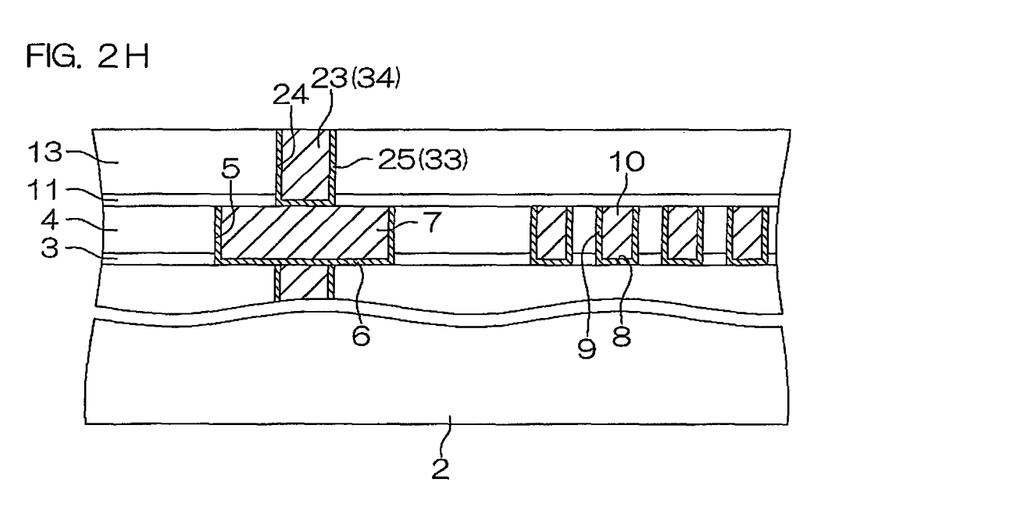
Figure 2K:
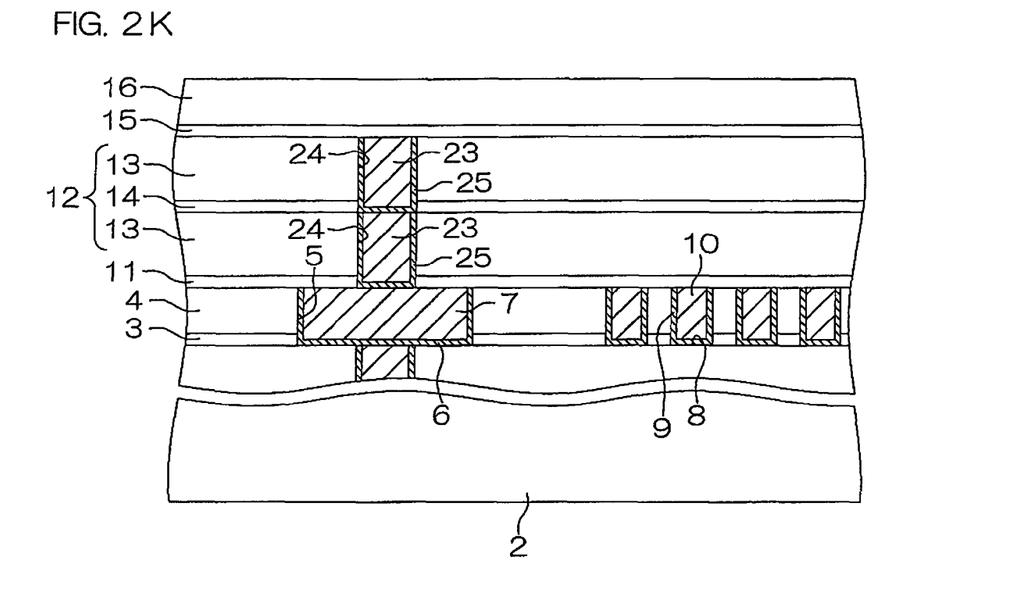
Figure 2L:
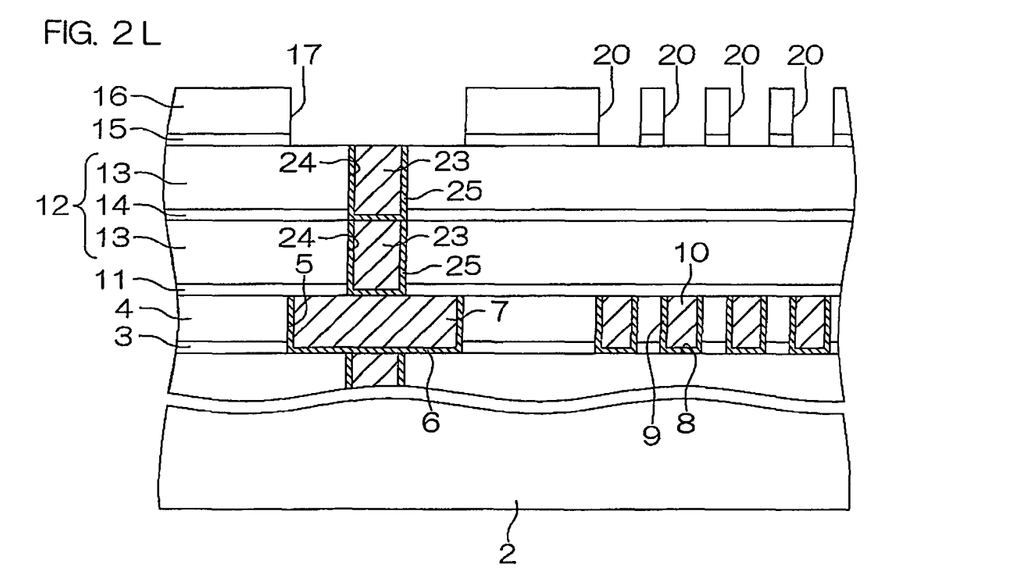
Figure 2M:
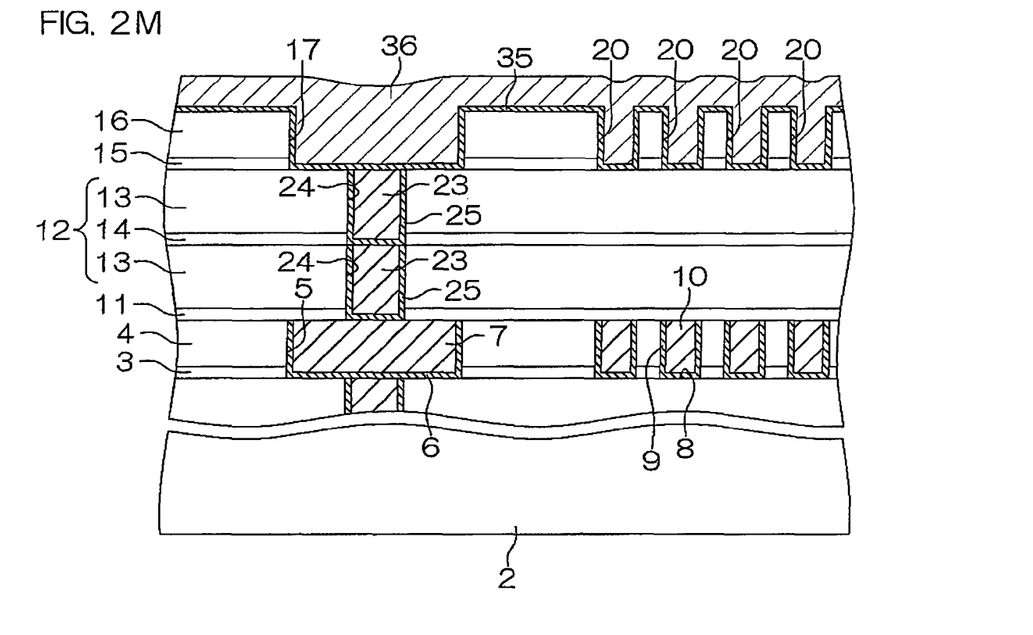
Figure 2N:
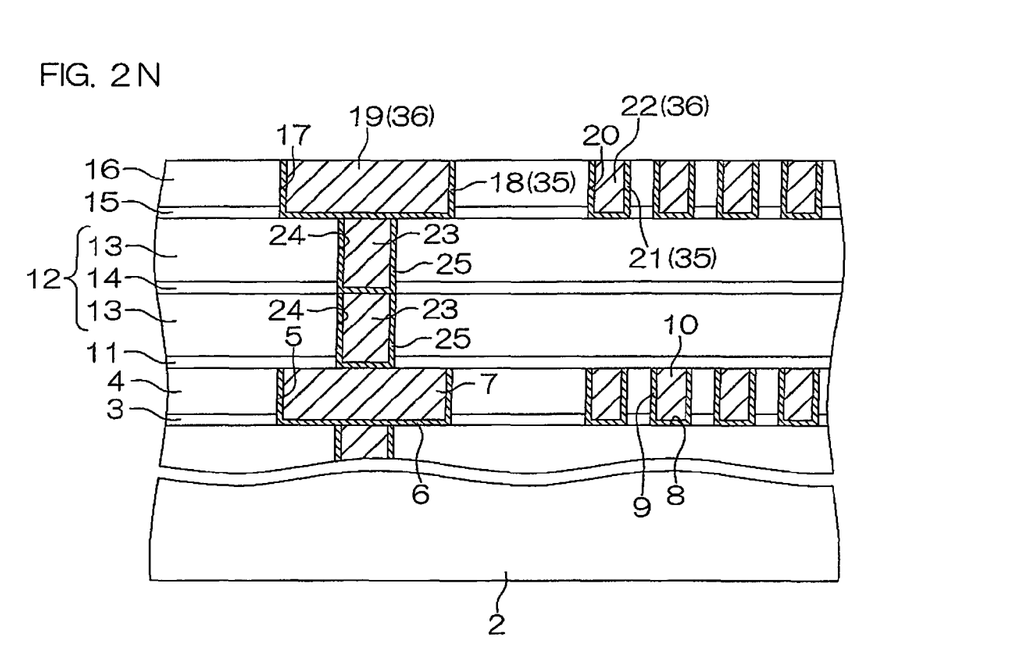

FIGS. 2A to 2N are schematic sectional views for illustrating a method of manufacturing the semiconductor device shown in FIG. 1.

As shown in FIG. 2A, the etching stopper film 3 and the first wiring layer 4 are stacked on the semiconductor substrate 2 by CVD (Chemical Vapor Deposition).

Then, the first wiring trench 5 and the first coil groove 8 are formed by photolithography and etching, as shown in FIG. 2B. At this time, the etching stopper film 3 is utilized as an etching stopper against etching of the first wiring layer 4.

Thereafter a multilayer film (a Ta film, a TaN film and a Ta film) 31 made of the material for the barrier metals 6 and 9 is formed on the upper surface of the first wiring layer 4 and the inner surfaces of the first wiring trench 5 and the first coil groove 8 by sputtering, as shown in FIG. 2C. Then, a plating layer 32 made of a Cu wire material is formed on the multilayer film 31 by plating. The first wiring trench 5 and the first coil groove 8 are filled up with the plating layer 32.

Then, the plating layer 32 and the multilayer film 31 are continuously polished by CMP, as shown in FIG. 2D. The polishing is continued until unnecessary portions of the plating layer 32 and the multilayer film 31 formed outside the first wiring trench 5 and the first coil groove 8 are entirely removed and the surface of the plating layer 32 buried in the first wiring trench 5 and the first coil groove 8 is flush with the surface (the upper surface) of the first wiring layer 4. Thus, the first wire 7 embedded in the first wiring trench 5 through the barrier metal 6 and the first coil 10 embedded in the first coil groove 8 through the barrier metal 9 are obtained. At this time, the surface of the first wiring layer 4 is also slightly polished.

Thereafter the diffusion preventing/etching stopper film 11 and the first dielectric film 13 are successively stacked by CVD, as shown in FIG. 2E.

Then, the via 23 is formed by a single damascene process. More specifically, the via hole 24 is formed by photolithography and etching, as shown in FIG. 2F. At this time, the diffusion preventing/etching stopper film 11 is utilized as an etching stopper against etching of the first dielectric film 13.

Thereafter a multilayer film (a Ta film, a TaN film and a Ta film) 33 made of the material for the barrier metal 25 is formed on the upper surface of the first dielectric film 13 and the inner surface of the via hole 24 by sputtering, as shown in FIG. 2G. Then, a plating layer 34 made of a Cu wire material is formed on the multilayer film 33 by plating. The via hole 24 is filled up with the plating layer 34.

Then, the plating layer 34 and the multilayer film 33 are continuously polished by CMP, as shown in FIG. 2H. The polishing is continued until unnecessary portions of the plating layer 34 and the multilayer film 33 formed outside the via hole 24 are entirely removed and the surface of the plating layer 34 buried in the via hole 24 is flush with the surface (the upper surface) of the first dielectric film 13. Thus, the via 23 embedded in the via hole 24 through the barrier metal 25 is obtained. At this time, the surface of the first dielectric film 13 is also slightly polished.

After the formation of the via 23, the second dielectric film 14 and the first dielectric film 13 are successively stacked by CVD, as shown in FIG. 2I.

Then, through steps similar to the steps shown in FIGS. 2F to 2H, the via hole 24 is formed in the first dielectric film 13 on the upper-layer side and the via 23 is embedded in the via hole 24 through the barrier metal 25, as shown in FIG. 2J. At this time, the second dielectric film 14 is utilized as an etching stopper against etching of the first dielectric film 13.

After the formation of the via 23, the etching stopper film 15 and the second wiring layer 16 are stacked on the first dielectric films 13 (the interlayer dielectric film 12) by CVD, as shown in FIG. 2K.

Then, the second wiring layer 17 and the second coil groove 20 are formed by photolithography and etching, as shown in FIG. 2L. The etching stopper film 15 is utilized as an etching stopper against etching of the second wiring layer 16.

Thereafter a multilayer film (a Ta film, a TaN film and a Ta film) 35 made of the material for the barrier metals 18 and 21 is formed on the upper surface of the second wiring layer 16 and the inner surfaces of the second wiring trench 17 and the second coil groove 20 by sputtering, as shown in FIG. 2M. Then, a plating layer 36 made of a Cu wire material is formed on the multilayer film 35 by plating. The second wiring trench 17 and the second coil groove 20 are filled up with the plating layer 36.

Then, the plating layer 36 and the multilayer film 35 are continuously polished by CMP, as shown in FIG. 2N. The polishing is continued until unnecessary portions of the plating layer 36 and the multilayer film 35 formed outside the second wiring trench 17 and the second coil groove 20 are entirely removed and the surface of the plating layer 36 buried in the second wiring trench 17 and the second coil groove 20 is flush with the surface (the upper surface) of the second wiring layer 16. Thus, the second wire 19 embedded in the second wiring trench 17 through the barrier metal 18 and the second coil 22 embedded in the second coil groove 20 through the barrier metal 21 are obtained. At this time, the surface of the second wiring layer 16 is also slightly polished.

Thereafter the diffusion preventing/etching stopper film 26 and the interlayer dielectric film 27 etc. are stacked on the second wiring layer 16 by CVD, and the semiconductor device 1 shown in FIG. 1 is obtained.

As hereinabove described, the interlayer dielectric film 12 formed on the semiconductor substrate 2 has the three-layer structure in which the second dielectric film 14 is interposed between the two first dielectric films 13. The first dielectric films 13 made of SiO$_2$ are compressive stress films. On the other hand, the second dielectric film 14 made of SiN is a tensile stress film. In other words, the interlayer dielectric film 12 has the multilayer structure of the compressive stress films and the tensile stress film. Therefore, compressive stress of the compressive stress films and tensile stress of the tensile stress film cancel each other on the semiconductor substrate 2. Even if the interlayer dielectric film 12 is formed in a relatively large thickness, therefore, the semiconductor substrate 2 can be inhibited from causing warping deformation.

The interlayer dielectric film 12 may alternatively have a two-layer structure formed by the first dielectric film 13 and the second dielectric film 14. In this case, the second dielectric film 14 can be substituted for the etching stopper film 15, and hence the etching stopper film 15 may be omitted.

Each first dielectric film 13 is provided with the via hole 24 passing through the first dielectric film 13, and the via 23 is embedded in each via hole 24 through the barrier metal 25. In order to form the via 23, selective etching of the first dielectric film 13 is performed (see FIG. 2F). In order to embed the via 23 in the via hole 24, further, polishing (planarization) of the plating layer 34, made of the material for the via, formed on the first dielectric film 13 is performed, and the first dielectric film 13 is also slightly polished (planarized) at this time. These treatments (steps) reduce the compressive stress of the first dielectric film 13. Therefore, the semiconductor substrate 2 can be inhibited from causing warping deformation also by embedding the via 23 in the first dielectric film 13.

The second dielectric film 14 is made of SiN, and has etching selectivity with respect to SiO$_2$, which is the material for the first dielectric film 13. Therefore, the second dielectric film 14 can be utilized as an etching stopper in the etching for forming the via hole 24 in the first dielectric film 13 on the upper-layer side. Consequently, the via hole 24 can be accurately formed without causing a so-called overetching.

SiN has a barrier property against Cu, and hence Cu contained in the via 23 can be prevented from diffusing into the first dielectric film 13 on the via 23, due to the second dielectric film 14.

Further, the diffusion preventing/etching stopper film 11 interposed between the first wire 7 and the interlayer dielectric film 12 is made of SiN, and has a barrier property against Cu. Therefore, Cu contained in the first wire 7 can be prevented from diffusing into the interlayer dielectric film 12 (the first dielectric films 13), due to the diffusion preventing/etching stopper film 11.

In addition, the diffusion preventing/etching stopper film 11 has tensile stress. Therefore, the compressive stress of the first dielectric films 13 can be canceled also by the tensile stress of the diffusion preventing/etching stopper film 11. Consequently, the semiconductor substrate 2 can be more effectively inhibited from causing warping deformation.

The interlayer dielectric film 12 formed on the semiconductor substrate 2 has the multilayer structure of the plurality of first dielectric films 13. On the semiconductor substrate 2, the first coil 10 and the second coil 22 constituting the transformer are provided to oppose to each other through the interlayer dielectric film 12. Each first dielectric film 13 is provided with the via hole 24 passing through the first dielectric film 13, and the via 23 is embedded in each via hole 24.

In order to form the via 23, the selective etching of the first dielectric film 13 is performed (see FIG. 2F). In order to embed the via 23 in the via hole 24, further, the polishing (planarization) of the plating layer 34, made of the material for the via, formed on the first dielectric film 13 is performed, and the first dielectric film 13 is also slightly polished (planarized) at this time. These treatments (steps) reduce the compressive stress of the first dielectric film 13. Even if the interlayer dielectric film 12 is formed in a relatively large thickness, therefore, the semiconductor substrate 2 can be inhibited from causing warping deformation by embedding the via 23 in the first dielectric film 13.

The interlayer dielectric film 12 includes the second dielectric film 14 made of SiN between the first dielectric films 13 made of $SiO_2$. The first dielectric films 13 made of $SiO_2$ are compressive stress films. On the other hand, the second dielectric film 14 made of SiN is a tensile stress film. In other words, the interlayer dielectric film 12 has the multilayer structure of the compressive stress films and the tensile stress film. Therefore, the compressive stress of the compressive stress films and the tensile stress of the tensile stress film cancel each other on the semiconductor substrate 2. Thus, the semiconductor substrate 2 can be more inhibited from causing warping deformation.

Each via 23 is formed by the single damascene process. In the single damascene process, the step of forming the via 23 in the first dielectric film 13 is separately carried out every first dielectric film 13, and the selective etching and the planarization of the first dielectric film 13 are carried out in each step. Therefore, the compressive stress of each first dielectric film 13 can be reduced. Consequently, the semiconductor substrate 2 can be effectively inhibited from causing warping deformation.

Figure 3:
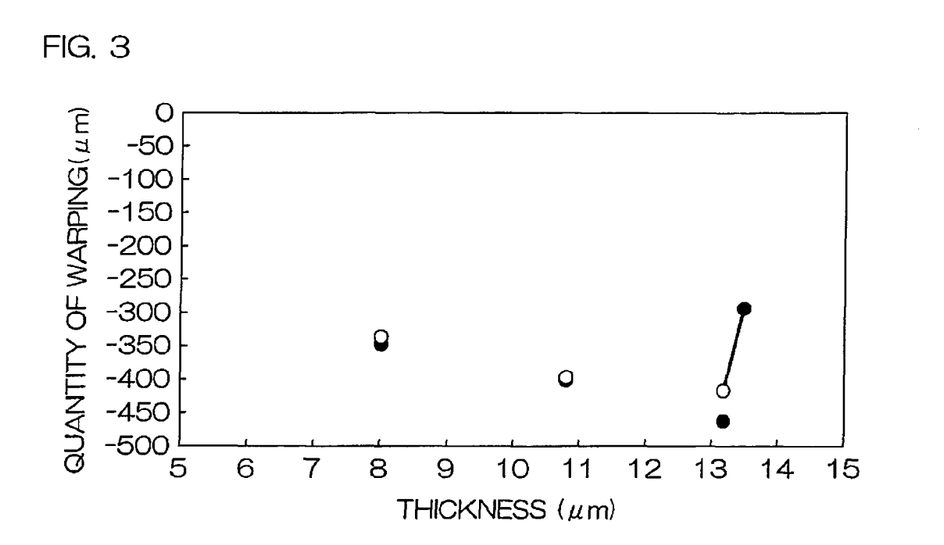
FIG. 3 is a graph showing changes in the quantities of warping of semiconductor wafers before and after steps of etching compressive stress films.

FIG. 3 is a graph showing changes in the quantities of warping of semiconductor wafers before and after steps of etching compressive stress films.

Three semiconductor wafers (bare silicon wafers) having diameters of 300 mm which were matrices for the semiconductor substrates 2 were prepared, compressive stress films made of $SiO_2$ having thicknesses of about 8 μm, about 11 μm and about 13 μm respectively were formed on the surfaces of the three semiconductor wafers, and the quantity of warping (the height with respect to a plane) of each semiconductor wafer was measured before and after an etching step for forming a through-hole in each compressive stress film. FIG. 3 shows the quantities of warping before the etching step with black circles, and shows the quantities of warping after the etching step with white circles.

It is understood from the results shown in FIG. 3 that the quantity of warping of the semiconductor wafer after the etching step is smaller than the quantity of warping of the semiconductor wafer before the etching step, in whichever thickness the compressive stress film is formed.

After the etching step on the compressive stress film of about 13 μm, a tensile stress film made of SiN of 0.3 μm was formed on the compressive stress film, and the quantity of warping of the semiconductor wafer was measured. The quantity of warping at this time was about 300 μm on a side where the surface of the semiconductor wafer was convexed, and it is understood that the same was by far smaller than about 460 μm which was the quantity of warping before the formation of the tensile stress film.

Figure 4:
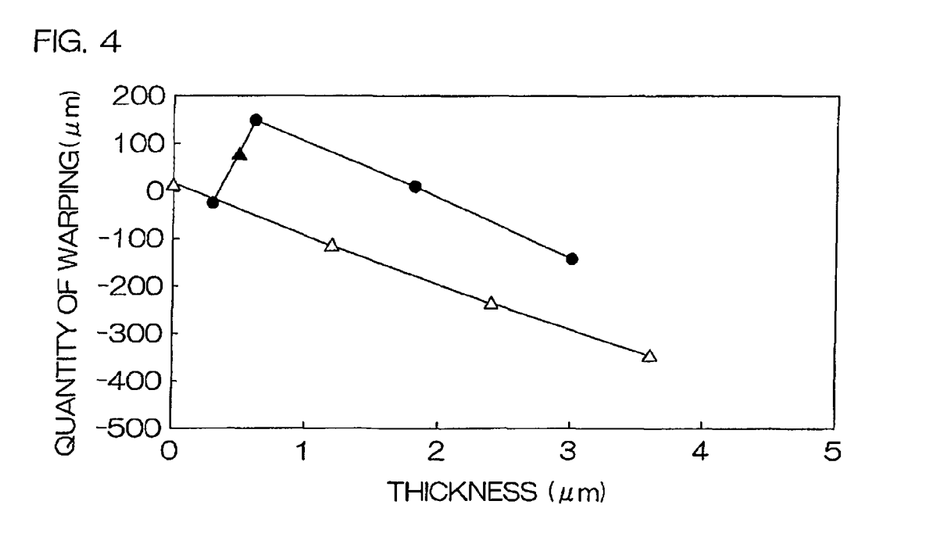
FIG. 4 is a graph showing the relation between the thicknesses of compressive stress films and the quantities of warping of semiconductor wafers.

FIG. 4 is a graph showing the relation between the thicknesses of compressive stress films and the quantities of warping of semiconductor wafers.

A semiconductor wafer (a bare silicon wafer) having a diameter of 300 mm which was a matrix for the semiconductor substrate 2 was prepared, and in the process of forming a compressive stress film made of $SiO_2$ on the surface of the semiconductor wafer, the quantity of warping (the height with respect to a plane) of the semiconductor wafer was measured every time the thickness of the compressive stress film increased by 1.2 μm. FIG. 4 shows the results of the measurement with white circles.

On the other hand, a tensile stress film made of SiN having a thickness of 0.3 μm was formed on the surface of another semiconductor wafer provided with a natural oxide film of 0.3 μm, and the quantity of warping of the semiconductor wafer after the formation of the tensile stress film was measured. The quantity of warping at this time was about 150 μm on a side where the surface of the semiconductor wafer was concaved. In the process of thereafter forming a compressive stress film made of $SiO_2$ on the tensile stress film, the quantity of warping of the semiconductor wafer was measured every time the thickness of the compressive stress film increased by 1.2 μm. FIG. 4 shows the results of the measurement with black circles.

In a case where only a compressive stress film is formed on the surface of a semiconductor wafer, for example, warping deformation of not less than 200 μm is caused on the semiconductor wafer at a moment when the compressive stress film is formed up to a thickness of 2.4 μm. In a case where a tensile stress film is formed on the surface of a semiconductor wafer, on the other hand, warping deformation is hardly caused on the semiconductor wafer at a moment when a compressive stress film is formed up to a thickness of 2.4 μm. It is understood from the results that the semiconductor substrate 2 can be inhibited from causing warping deformation, due to the multilayer structure of the compressive stress films and the tensile stress film.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-248903 and Japanese Patent Application No. 2008-248904 filed with the Japan Patent Office on Sep. 26, 2008, the entire disclosures of which are incorporated herein by reference.

DESCRIPTION OF THE REFERENCE NUMERALS 1 semiconductor device
2 semiconductor substrate
7 first wire
10 first coil
11 diffusion preventing/etching stopper film
12 interlayer dielectric film
13 first dielectric film (compressive stress film)
14 second dielectric film (tensile stress film)
19 second wire
22 second coil
23 via

The invention claimed is:
1. A semiconductor device comprising:
a semiconductor substrate;
a first etching stopper film formed on the semiconductor substrate;
a first wiring layer formed on the first etching stopper film;
a first trench being within the first etching stopper film and the first wiring layer;
a diffusion preventing/etching stopper film;

an interlayer dielectric film formed on the diffusion preventing/etching stopper film, the interlayer dielectric film having a multilayer structure including compressive stress layers made of $SiO_2$ and tensile stress layers made of SiN, all of every compressive stress layer of the multilayer structure being thicker than all of every tensile stress layer of the multilayer structure;
a second etching stopper film formed on the interlayer dielectric film;
a second wiring layer formed on the second etching stopper film;
a second trench being within the second etching stopper film and the second wiring layer, the second trench opposed to the first trench through the interlayer dielectric film;
a first wire disposed in the first trench; and
a second wire disposed in the second trench; and
a plurality of vias, provided in via holes passing through the interlayer dielectric film, for electrically connecting the first wire and the second wire with each other,
wherein the first wire and the second wire each have an outermost diameter larger than that of the vias.

2. The semiconductor device according to claim 1, wherein
the multilayer structure has the tensile stress layers and the compressive stress layers laminated alternately and repetitively.

3. The semiconductor device according to claim 1, wherein
the tensile stress layers have etching selectivity with respect to the compressive stress layers.

4. The semiconductor device according to claim 1, further comprising:
a first coil made of a wire formed in a same wiring layer as the first wire; and
a second coil made of a wire formed in a same wiring layer as the second wire.

5. The semiconductor device according to claim 4, wherein the first coil and the second coil constitute a transformer.

6. The semiconductor device according to claim 1, wherein the interlayer dielectric film has a thickness of more than 5 µm.

7. The semiconductor device according to claim 3, wherein the multilayer structure has the tensile stress layers and the compressive stress layers laminated alternately and repetitively.

8. The semiconductor device according to claim 4, wherein the semiconductor substrate, the first coil, the interlayer dielectric film and the second coil are disposed in that stated order along a straight line.

9. The semiconductor device according to claim 1, wherein the tensile stress layers have etching selectivity with respect to the compressive stress layers so that the tensile stress layers are configured to serve as an etching stopper when the compressive stress layers are etched.

10. The semiconductor device according to claim 4, wherein
the first coil and the second coil are made of a metallic material containing Cu, and
the tensile stress layer is made of a material having a barrier property against Cu.

11. The semiconductor device according to claim 1, further comprising:
a barrier metal,
wherein the via holes pass through the compressive stress layers,
wherein the first wire is free of direct physical contact with the second wire,
further wherein the second wire is provided on a side of the interlayer dielectric film that is opposite the side of the interlayer dielectric film that the first wire is provided upon,
further wherein the vias have the barrier metal interposed therebetween.

12. A semiconductor device comprising:
a semiconductor substrate;
a first etching stopper film formed on the semiconductor substrate;
a first wiring layer formed on the first etching stopper film;
a first trench being within the first etching stopper film and the first wiring layer;
a diffusion preventing/etching stopper film;
an interlayer dielectric film formed on the diffusion preventing/etching stopper film, the interlayer dielectric film having a multilayer structure including compressive stress layers made of $SiO_2$ and tensile stress layers made of SiN, all of every compressive stress layer being thicker than all of every tensile stress layer;
a second etching stopper film formed on the interlayer dielectric film;
a second wiring layer formed on the second etching stopper film;
a second trench being within the second etching stopper film and the second wiring layer, the second trench opposed to the first trench through the interlayer dielectric film;
a first wire disposed in the first trench; and
a second wire disposed in the second trench; and
a plurality of vias, provided in via holes passing through the interlayer dielectric film, for electrically connecting the first wire and the second wire with each other,
wherein the first wire and the second wire each have an outermost diameter larger than that of the vias, and
the tensile stress layers and the compressive stress layers are laminated alternately and repetitively.

13. A semiconductor device comprising:
a semiconductor substrate;
a first etching stopper film formed on the semiconductor substrate;
a first wiring layer formed on the first etching stopper film;
a first trench being within the first etching stopper film and the first wiring layer;
a diffusion preventing/etching stopper film;
an interlayer dielectric film formed on the diffusion preventing/etching stopper film, the interlayer dielectric film having a multilayer structure including compressive stress layers made of $SiO_2$ and tensile stress layers made of SiN, all of every compressive stress layer of the multilayer structure being thicker than all of every tensile stress layer of the multilayer structure;
a second etching stopper film formed on the interlayer dielectric film;
a second wiring layer formed on the second etching stopper film;
a second trench being within the second etching stopper film and the second wiring layer, the second trench opposed to the first trench through the interlayer dielectric film;
a first wire disposed in the first trench;
a second wire disposed in the second trench; and a plurality of vias, provided in via holes passing through the interlayer dielectric film, for electrically connecting the first wire and the second wire with each other, wherein the first wire and the second wire each have an outermost diameter larger than that of the vias, and in a sectional view, the first wire has a same shape and size as the second wire.

* * * * *